United States Patent [19]

Konrad et al.

[11] Patent Number: 5,893,983
[45] Date of Patent: Apr. 13, 1999

[54] TECHNIQUE FOR REMOVING DEFECTS FROM A LAYER OF METAL

[75] Inventors: John Joseph Konrad, Endicott; Voya Rista Markovich, Endwell; George Frederick Reel, Endicott; Jose Antonio Rios, Binghamton; Timothy Leroy Wells, Apalachin; Michael Wozniak, Vestal, all of N.Y.

[73] Assignee: International Business Machines Corporation, Armonk, N.Y.

[*] Notice: This patent is subject to a terminal disclaimer.

[21] Appl. No.: 08/758,272

[22] Filed: Nov. 19, 1996

Related U.S. Application Data

[63] Continuation-in-part of application No. 08/704,193, Aug. 28, 1996, Pat. No. 5,759,427.

[51] Int. Cl.$^6$ .................. C23F 1/02; C23F 1/44; C23F 1/08; H05K 3/06
[52] U.S. Cl. .................. 216/91; 216/92; 216/105; 216/106; 438/691; 438/748; 156/345; 252/79.2; 510/254
[58] Field of Search .................. 252/79.2; 510/254; 216/38, 53, 106, 91, 92, 105; 438/691, 748; 156/345

[56] References Cited

U.S. PATENT DOCUMENTS

| | | | |
|---|---|---|---|
| 4,250,588 | 2/1981 | Cook et al. | 15/77 |
| 4,269,138 | 5/1981 | Dinella et al. | 118/115 |
| 4,438,795 | 3/1984 | Plough | 144/114 R |
| 4,475,981 | 10/1984 | Rea | 156/636 |
| 4,835,909 | 6/1989 | Richter et al. | 51/281 |
| 4,944,836 | 7/1990 | Beyer et al. | 156/645 |
| 4,964,365 | 10/1990 | D'Amato | 118/419 |
| 5,128,010 | 7/1992 | Ye | 204/212 |
| 5,225,034 | 7/1993 | Yu et al. | 156/636 |
| 5,232,501 | 8/1993 | Pender et al. | 118/300 |
| 5,312,887 | 5/1994 | Papathomas | 528/67 |
| 5,335,681 | 8/1994 | Schmid | 134/64 |
| 5,348,615 | 9/1994 | Gupta | 156/635 |
| 5,391,258 | 2/1995 | Brancaleoni et al. | 156/636 |
| 5,399,528 | 3/1995 | Leibovitz et al. | 437/195 |
| 5,468,409 | 11/1995 | Dull | 252/79.2 |
| 5,759,427 | 6/1998 | Cibulsky et al. | 216/91 |

FOREIGN PATENT DOCUMENTS

| | | |
|---|---|---|
| 7-183518 | 7/1995 | Japan. |
| 7-230973 | 8/1995 | Japan. |
| 197706 | 6/1977 | U.S.S.R. . |

OTHER PUBLICATIONS

"Planarization of Films Used in IC Fabrication by Laser-Induced Chemical Etching," C.J. Hendricks, IBM Technical Disclosure Bulletin, vol. 26, No. 10B, Mar., 1984.

Primary Examiner—Matthew V. Grumbling
Attorney, Agent, or Firm—Calfee, Halter & Griswold LLP

[57] ABSTRACT

A technique for polishing an exposed surface of metal on a substrate to remove defects from mechanical working of metals, such as burrs and pigtails resulting from drilling, and defects from plating, such as nodules and depressions, is provided. The substrate has an exposed metal surface such as copper thereon which is to be treated to remove defects. A planarizing or polishing head, preferably a rotating roller, is provided which is continuously rotating with respect to the substrate, with the head in contact with the metal surface on the substrate. A chemical etchant, essentially free of abrasive material, is continuously supplied to the interface between the metal surface and the head. The treating and polishing continues until the defects have been removed or reduced to an acceptable value. In some instances where significant height reduction is required, thus requiring significant metal removal, several passes of the substrate may be required or a device with multiple heads may be used. The polishing head preferably includes a film having a layer of very fine grit embedded therein, such as 5µ–15µ silicon carbide (SiC).

12 Claims, 6 Drawing Sheets

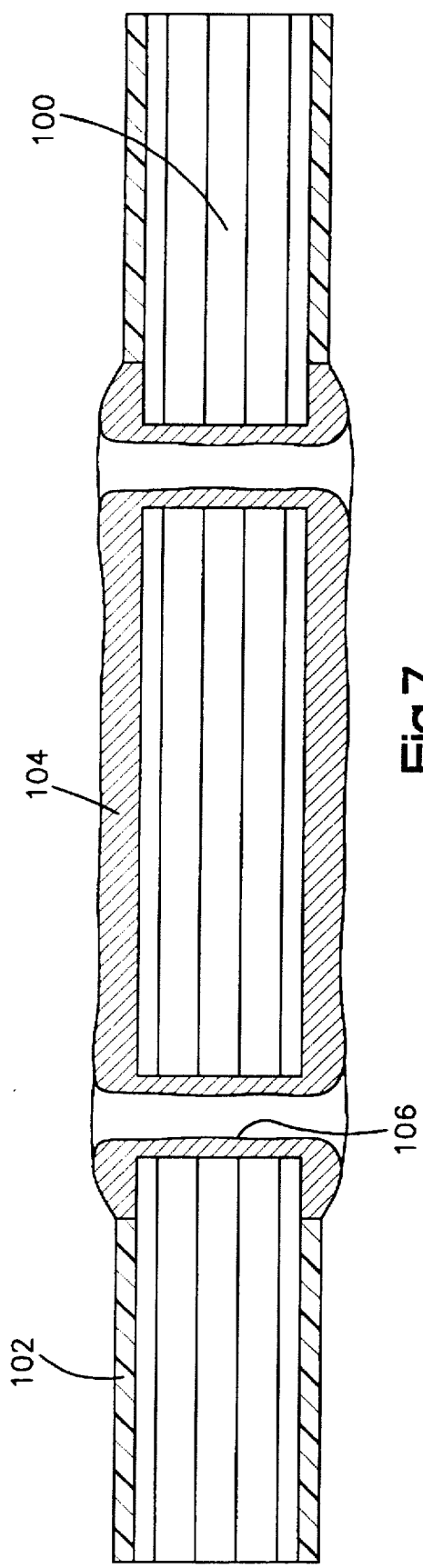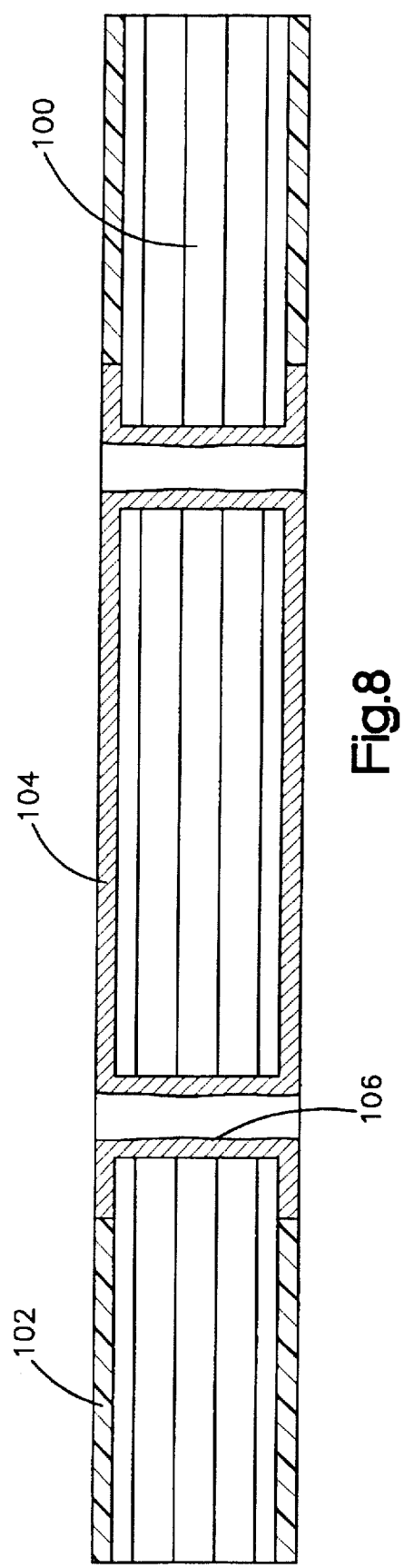

TECHNIQUE FOR REMOVING DEFECTS FROM A LAYER OF METAL

RELATED APPLICATIONS

The present application is a Continuation-in-Part of application Ser. No. 08/704,193, filed Aug. 28, 1996, entitled "Method and Apparatus for Polishing Metal Surfaces" (Attorney Docket No. EN9-96-014) now U.S. Pat. No. 5,759,427; and is related to application Ser. No. 08/495,277, filed Jun. 27, 1995, entitled "Method of Producing Fine-Line Circuit Boards Using Chemical Polishing (Attorney Docket No. EN9-95-021).

FIELD OF THE INVENTION

This invention relates generally to the polishing of metal surfaces on substrates, and more particularly to the defects from circuitry on circuit boards and the like.

BACKGROUND INFORMATION

There are several different methods of plating and creating printed circuit lines on substrates such as circuit boards and circuit cards which are presently in use. Of these, additive panel plating is utilized to control both line height and line width. However, this method is costly and time-consuming. The above disclosed application Ser. No. 08/495,277 describes a method of producing fine-line circuit boards using chemical polishing. As disclosed therein, the printed circuit board is produced from an initial substrate board coated with a resist layer. The resist layer is patterned according to a circuit mask that defines circuit paths. The pattern resist layer is then selectively removed from the board in the desired circuit paths, and a conductive material is deposited on the board in the areas where the resist was removed as defined by the circuit mask. The conductive material is deposited so that the height of the conductive material relative to the substrate board equals or exceeds the height of the resist layer relative to the substrate board. In a first etching step, a low reactive solution is to applied over the conductive material and slowly dissolves it by first forming a film layer. Mechanical contact is then used to remove this film layer on any surface above the resist layer. The removal of the thin film layer allows a new conductive material surface layer to be exposed to the solution, and a new film layer to be formed. This process continues until the height of the resist layer is reached. At this point, when contact with the conductive material cannot be made without contacting the resist layer, a final film layer is formed. This final film layer then becomes a barrier to the low reactive solution and, in fact, on any area that is below the resist layer, such as a plated through hole. In this way, no abrasive materials are used in ensuring that the height of the conduct line will be substantially uniform and will conform to substrate undulations and surface irregularities. Conductive line width control is defined by the developed resist image. Circuit boards are then produced so as to have uniform height and precise width, even with organic flexible composition substrates. As taught in application Ser. No. 08/495,277, the relative height of the conductive material is determined by viewing a section of the board under an optical magnifying glass, such as a microscope, to determine when the relative heights are the same. As disclosed therein, the etching solution is applied, allowed to react and form a barrier, then removed. Then, a new solution is applied, the barrier is formed, and the barrier is removed. This process is repeated until an essentially planarized surface of copper circuitry is obtained.

Application Ser. No. 08/704,193 discloses a method and apparatus for planarizing a surface. This application specifically describes planarizing a surface wherein metal has been additive plated using photolithographic techniques to form a smooth top surface of metal coplanar with the cured resist.

SUMMARY OF THE INVENTION

A technique for polishing an exposed surface of metal on a substrate to remove defects from mechanical working of metals, such as burrs and pigtails resulting from drilling, and defects from plating, such as nodules and depressions, is provided. The substrate has an exposed metal surface such as copper thereon which is to be treated to remove defects. A planarizing or polishing head is provided which is continuously moving with respect to the substrate, with the head in contact with the metal surface on the substrate. A chemical etchant, essentially free of abrasive material, is continuously supplied to the interface between the metal surface and the head. The treating and polishing continues until the defects have been removed or reduced to an acceptable value. In some instances where significant height reduction is required, thus requiring significant metal removal, several passes of the substrate may be required or a device with multiple heads may be used. The polishing head preferably includes a film having a layer of very fine grit embedded therein, such as 5µ–15µ silicon carbide (SiC).

DESCRIPTION OF THE DRAWINGS

FIG. 7 is a longitudinal, sectional view of a portion of a circuit board to be planarized, shown somewhat schematically;

FIG. 8 is a view of the circuit board after having been planarized;

DESCRIPTION OF THE PREFERRED EMBODIMENT

Figure 1:
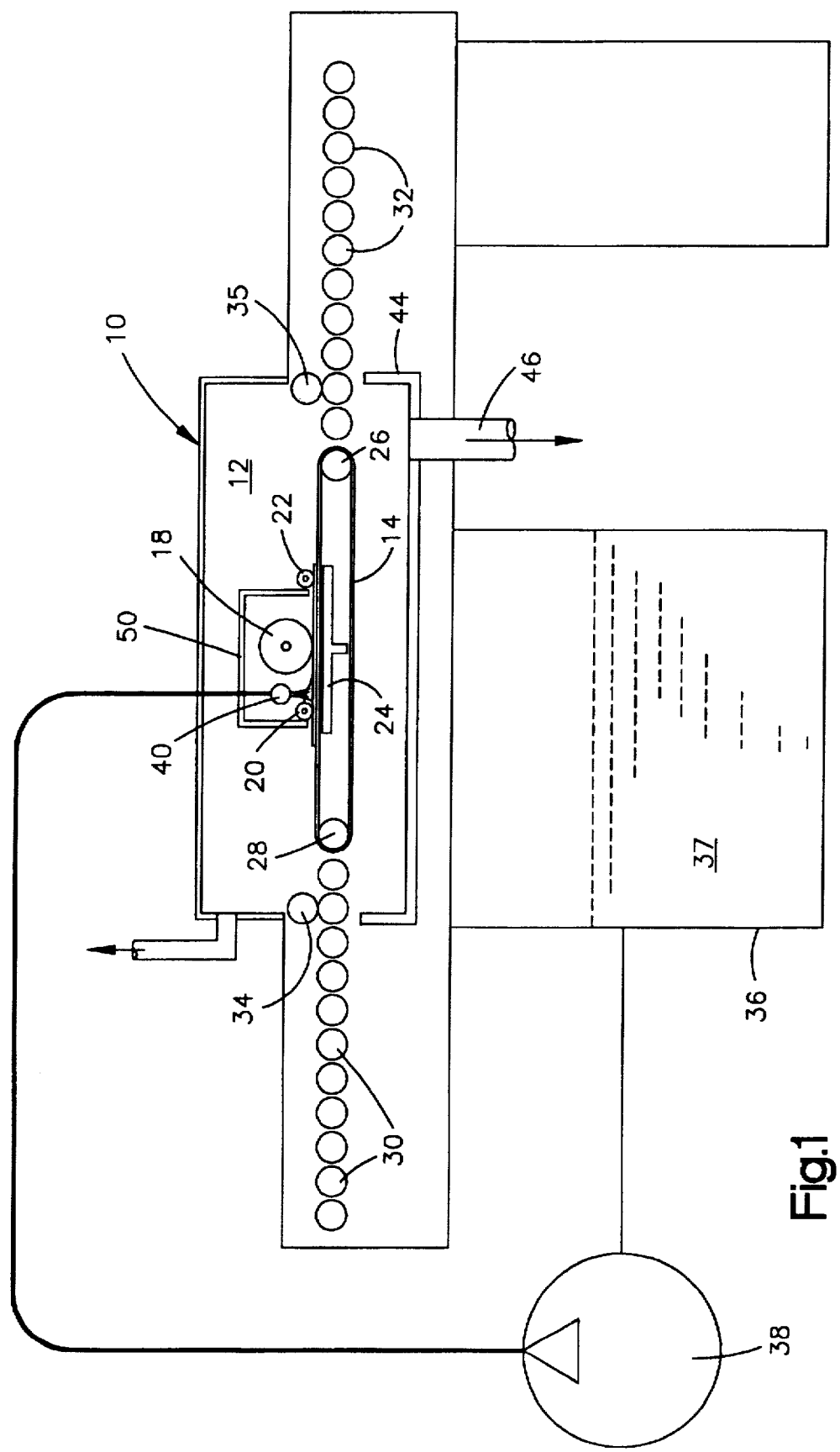
FIG. 1 is a side elevational view somewhat diagrammatic, with parts broken away for clarity, of a planarizing device according to this invention.
Figure 2:
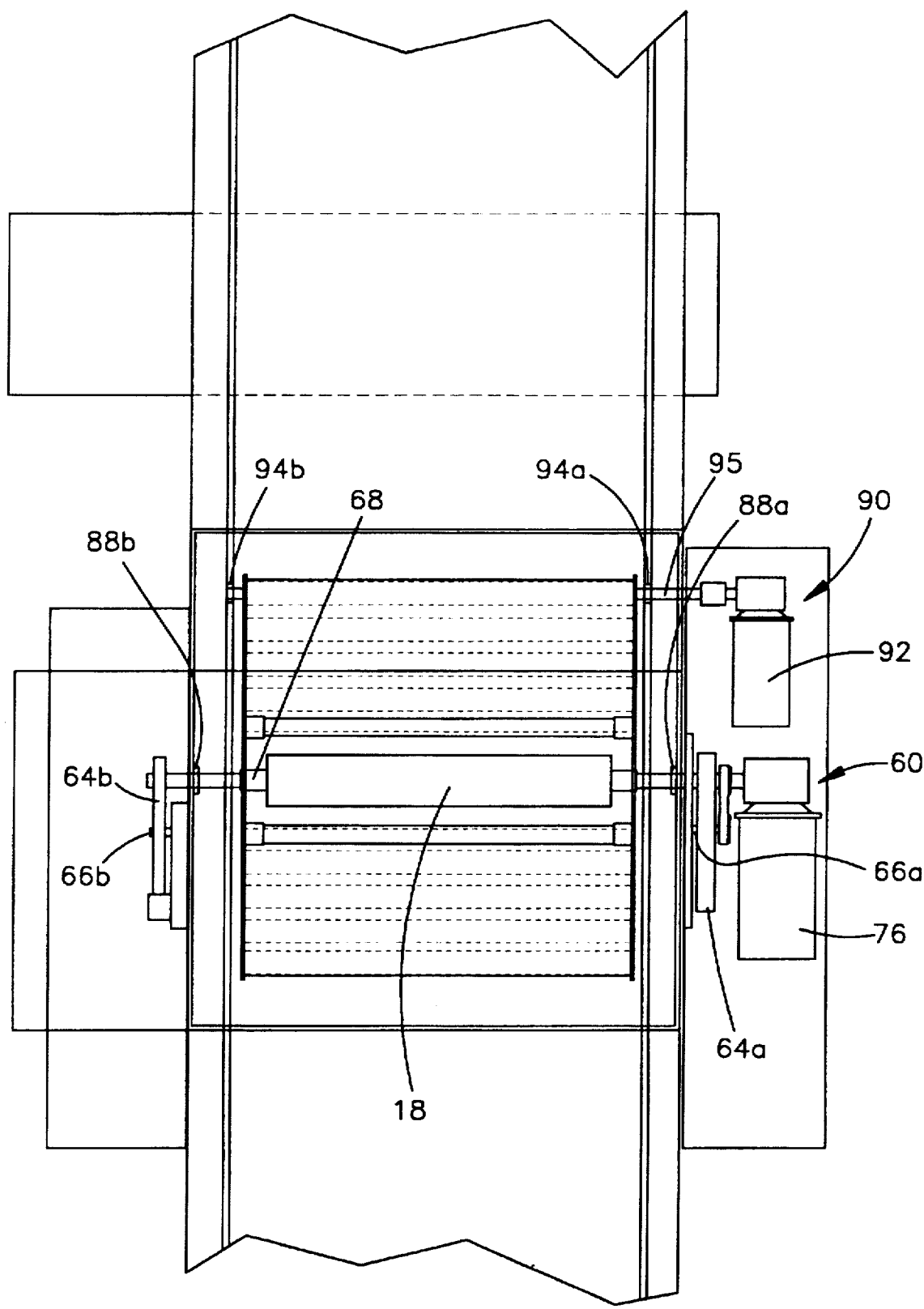
FIG. 2 is a top plan view of the device of this invention, with parts broken away for clarity, in an enlarged scale from FIG. 1.
Figure 3:
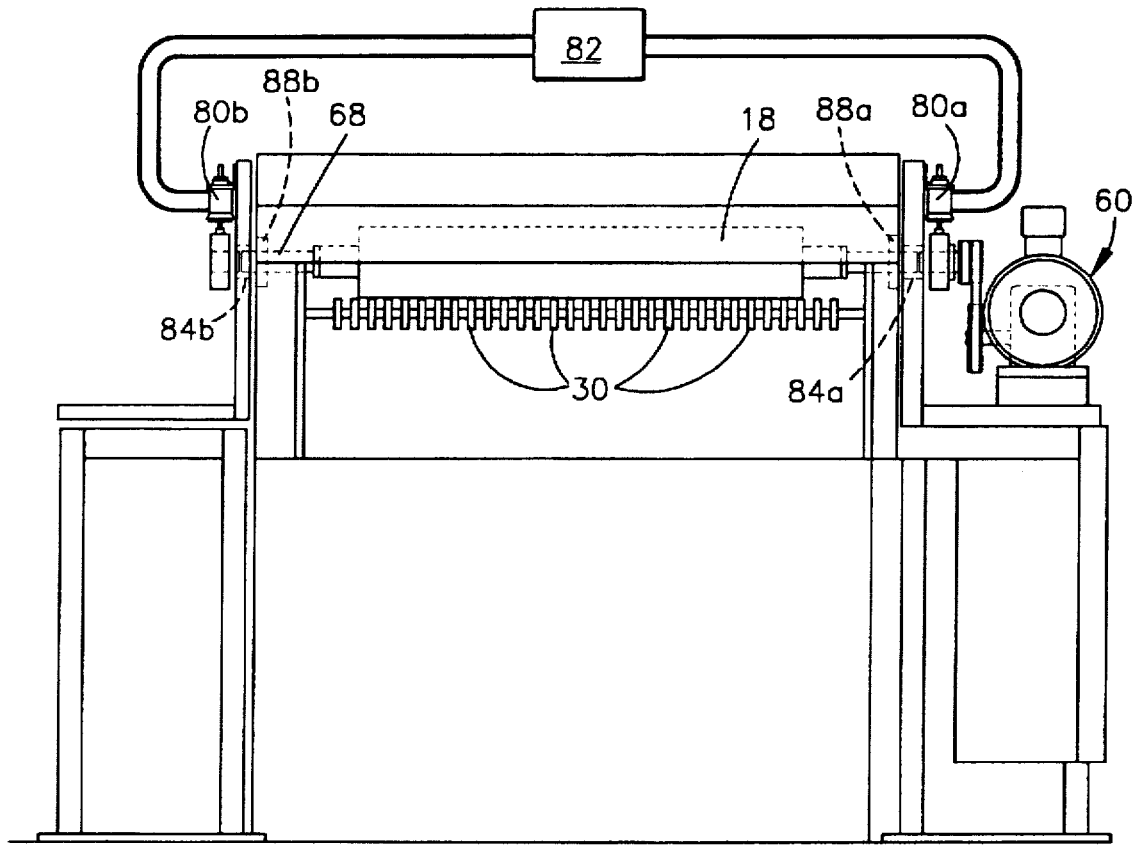
FIG. 3 is an end elevational view of the device of this invention, with parts broken away for clarity.
Figure 6:
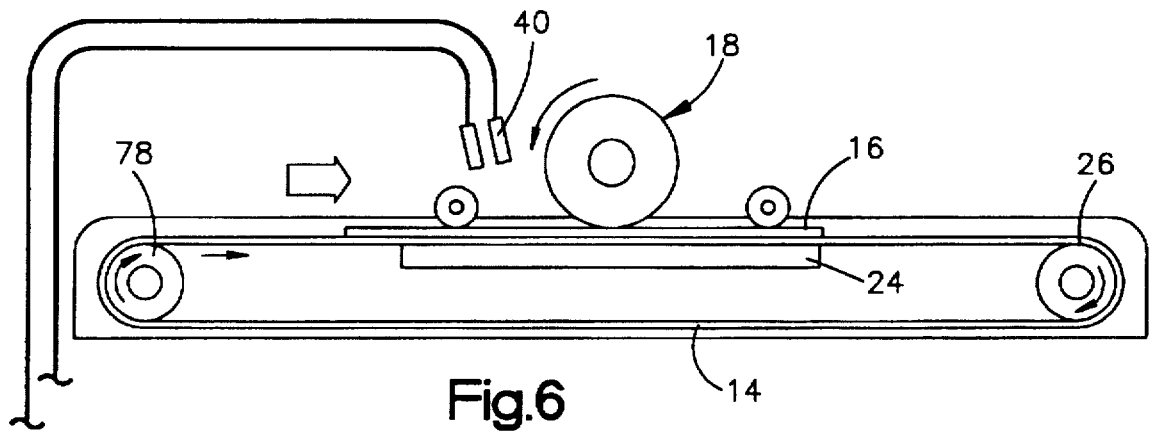
FIG. 6 is a schematic representation of the progress of the workpiece through the device.

Referring now to the drawings, and for the present to FIGS. 1 through 6, a planarizing device according to the present invention is shown. The device includes a work chamber housing, designated generally as 10, defining a work chamber 12 therein. Contained within the work chamber 12 is a conveyor belt 14 to support workpieces, one of which is shown at 16 thereon (FIG. 6). The workpieces will be described in more detail presently. A cylindrical planarizing or polishing head 18 is also contained within the work chamber 12 carried by mountings which will be described presently. A pair of pinch rolls 20 and 22 are mounted for rotation on opposite sides of the planarizing head 18 on bearings (not shown), and a pressure plate 24 is mounted below the top surface of the conveyor. A drive roll 26 and an idler roll 28 are provided for driving the conveyor belt 14, the mounting of which will be described presently. Also disposed within the work chamber housing 10 are entrance rollers 30 and exit rollers 32 which are individually driven in a well-known manner to provide for supplying and discharging workpieces to and from the conveyor belt 14. Pinch rolls 34 and 35 may also be provided above the rollers 30 and 32 as shown.

An etchant supply tank 36 is provided which is configured to hold a liquid etchant 37. A pump 38 is connected to the etchant supply tank 36 and to a spray head 40 positioned between the pinch roll 20 and planarizing head 18.

A collection tray 44 is also disposed within the work chamber housing 12 and positioned to collect the unused and spent etchant from the workpieces as they exit the conveyor. The collection tray 44 has a drain 46 which allows the spent etchant to drain either for recovery or for waste disposal. A splash guard 50 surrounds the planarizing head 18 and spray head 40 to prevent splashing and spraying of the etchant.

As can best be seen in FIGS. 2–6, the planarizing head 18 is mounted on a planarizing head mounting designated generally as 60. The planarizing head mounting 60 includes a pair of pivot arms 64a and 64b mounted on opposite sides of the housing 10 on pivot pins 66a and 66b, respectively. Self-aligning bearings (not shown) mount shaft 68 of the planarizing head to one end of each of the pivot arms 64a and 64b. Sheave 70 is mounted on the pivot pins 66a and sheaves 72 is mounted on the end of the shaft 68. Belt 74 connects sheaves 70 and 72. A motor 76 is mounted on one side of the housing 10 and is connected through belt 78 to sheave 70. Therefore, rotation of the motor 76 will cause the belt 78 to drive the sheaves through belts 78 and 74 thus rotating the planarizing head 18.

Pneumatic pressure arm assemblies 80a and 80b are connected respectively to the ends of pivot arms 64a and 64b opposite the ends to which the shaft 68 is attached.

Each of the assemblies 80a and 80b is connected to a pneumatic controller 82. The shaft 68 passes through U-shaped openings 84a and 84b on opposite sides of the housing 10, such that movement of the pivot arms 64a and 64b about pivot pins 66a and 66b will allow the shaft 68, and thus the planarizing head 18, to move toward and away from the conveyor belt 14. The mounting of the planarizing head in order to insure it running parallel to the conveyor belt 14 is especially important. In order to seal the U-shaped openings 84a and 84b, disc seals 88a and 88b are mounted on the opposite ends of the shaft 68 adjacent the interior of the U-shaped openings 84a and 84b.

The drive roll 26 is connected to a drive shaft assembly 90, which includes a drive motor 92 and bearings 94a and 94b mounting drive roll shaft 95 on opposite sides of the housing 10. The idler roller 28 is mounted within the work chamber 12 on bearings (not shown).

In operation, the device planarizes workpieces using essentially a chemical etchant without the addition of abrasives thereto.

Referring now to FIG. 7, a portion of a circuit board is shown very schematically, processed to a point where planarization is to take place. Such processing is described in co-pending application (EN9-95-021) and need not be described further. Essentially, the circuit board to be planarized has a substrate 100 on which is deposited photoresist 102 which has been patterned to receive circuitry 104 formed thereon by conventional plating techniques as described therein. The circuitry includes plated through holes 106, extending from one side of the substrate 100 to the opposite side of the substrate. As can be seen in FIG. 7, the top surface of the circuitry 104 is rather irregular (i.e. non-planar) and extends above the top surface of the photoresist 102. The purpose of the planarizing is to remove this excess of metal which extends above the photoresist 102 so as to form a smooth top surface of the circuitry 104 which is essentially flat, smooth and co-planar with the top surface of the photoresist 102 as shown in FIG. 8. To this end, the circuit board as shown in FIG. 7 is passed through the planarizing device, the planarizing head rotating and planarizing etchant applied so as to remove the excess metal extending above the photoresist and resulting in the planarized surface as shown in FIG. 8. This is shown schematically in FIG. 6.

Depending upon how much metal has to be removed, the planarizing may be accomplished in a single step, i.e., a single pass through the planarizing device, or the end result may require multiple passes through the planarizing device. In any event, during each pass, the substrate is fed into the work chamber on rollers 30 to the conveyor 14 where it is passed underneath the pinch roll 20, and the conveyor belt 14 drives the workpieces 16 past the planarizing head 18 which is rotated as shown in FIG. 6. Alternatively, a single pass can result in sufficient metal removal with the machine constructed of multiple planarizing heads, arrayed in succession. Each head is independently mounted and controlled in the same manner as described with respect to the single head. In such a case, a single pass can result in sufficient metal removal.

The conveyor 14 is formed of an etchant-resistant material and preferably has a roughened surface to prevent the rotating planarizing head 18 from moving the workpiece on the conveyor 14. A preferable material for forming the conveyor is polyvinylchloride. The etchant solution 37 is supplied from the tank 36 by pump 38 to spray head 40, where it is applied to the surface of the workpiece 16. In a typical embodiment, the circuitry is formed of copper, and the preferred etchant 37 is cupric chloride and hydrochloric acid as described in the above noted application. It is to be understood that other metals, such as aluminum, can be used to form the circuitry, in which case other etchants, such as hydrochloric acid would be used.

The controller 82 controls the operation of the planarizing head 18 so as to position the planarizing head 18 above the moving conveyor and maintain parallel therewith and exert a downward force on the head 18 into contact with the surface of the workpiece 46. The etchant solution 37 is pumped from the tank 36 by pump 38 to spray head 40 where it is dripped onto the surface of the workpiece causing a chemical reaction to take place to dissolve the raised portion of the metal. The rotating head removes the reaction product as it is formed and brings new solution into contact with the revealed new surface of metal. The spent solution and reaction product are caught in the collection tray 44 and exhausted through the drain 46.

Figure 9:
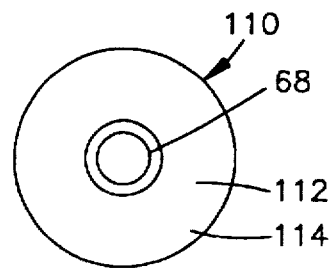
FIG. 9 is a transverse sectional view of one embodiment of a planarizing head according to this invention.

The structure and composition of the planarizing roll are dictated to a large extent by whether a single pass can be used or whether multiple passes are needed to effect planarization. If the planarization can be performed in a single pass with a single head, a roll of the type shown in FIG. 9 is preferred. In this case, the planarizing head is formed of a rubber roller 110 bonded to the shaft 68 which shaft preferably is formed from titanium or other etch-resistant material. The rubber is controlled so as to have a relatively soft interior 112 and a relatively hard exterior 114, the demarcation being indicated by a dotted line. Particularly, the hard outside should have a durometer reading of about 60, whereas the soft interior should have a durometer reading of about 15. However, these values can vary, it being desired that, when the head 18 is urged against the top surface of the workpiece that there be an optimal contact length of about ⅛ of an inch. Thus, the selection of the size and hardness of the rubber, together with the pressure applied by the controller 68, will dictate the parameters so that preferably an approximately ⅛ inch contact length is afforded. In such a case, the planarizing is accomplished without the provision of any type of abrasive in any form.

Figure 10:
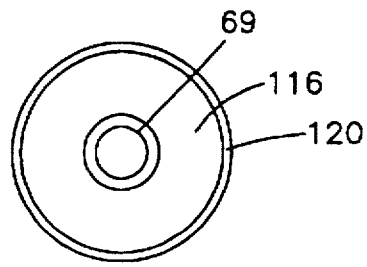
FIG. 10 is a transverse sectional view of another embodiment of a planarizing head according to this invention.
Figure 4:
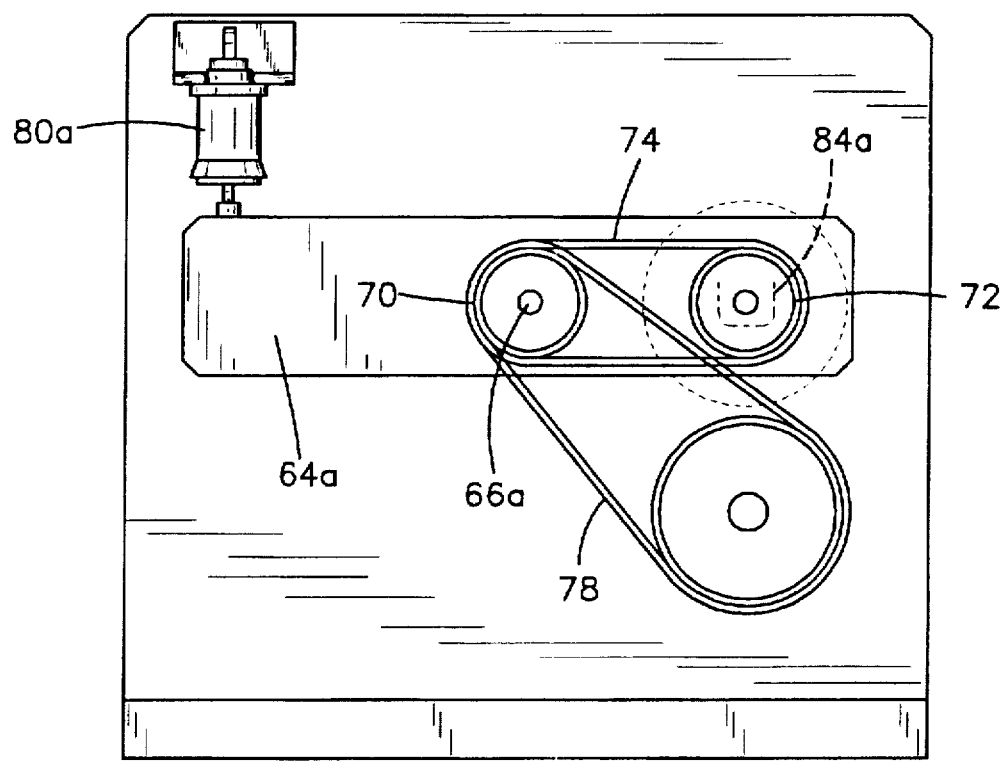
FIG. 4 is a side elevational view of the mounting of one side of the planarizing head according to this invention.
Figure 5:
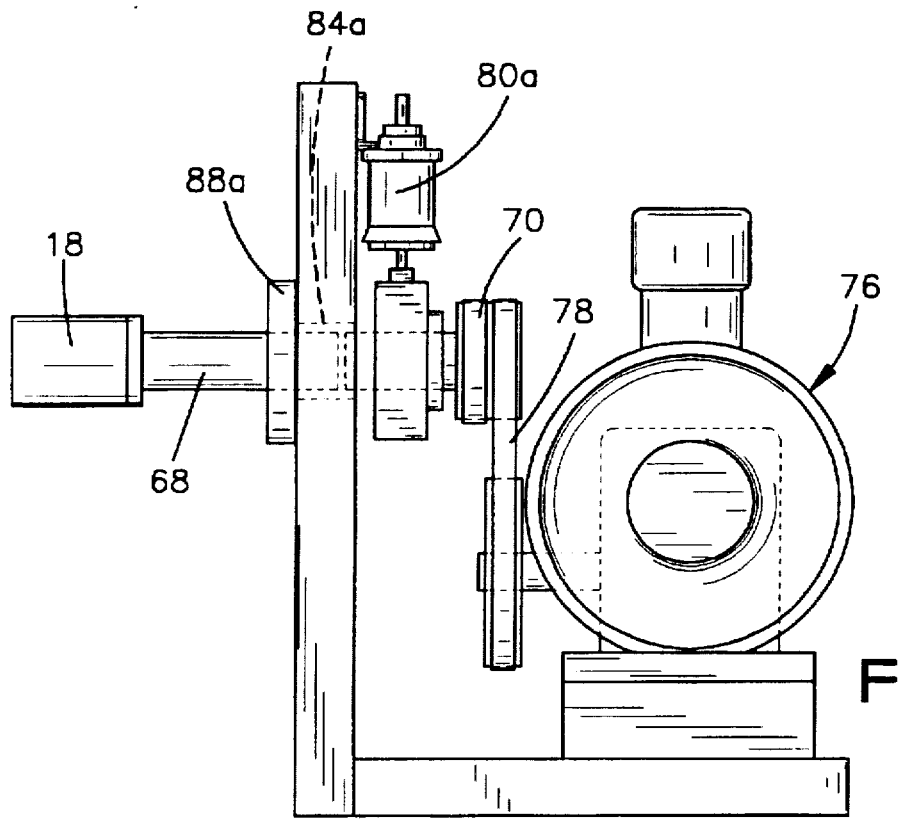
FIG. 5 is an end elevational view of the mounting shown in FIG. 4.

However, if multiple passes are required or multiple heads are employed, it is frequently desirable to use a different type of roll which will speed up the process somewhat during the passes previous to the final pass or final head; and, on the final pass a roll of the type just described can be used. In the initial passes on multiple pass planarizations or on the initial heads of multiple head machines, a roller of the type shown in FIG. 10 is preferred. In this configuration, foam rubber covering 116 is applied over a shaft 69 of PVC tubing, and a polyester film 120 of material having very fine silicon carbide particles embedded therein is applied over the foam rubber 116. The silicon carbide particles are preferably no larger than 15 microns, and can range in size from about 15 microns to about 5 microns. Because of the very soft foam rubber, during the planarization pass the length of contact of the surface of the head 18 with the substrate is optimally about 1 inch. Thus, for multiple passes or in multiple head devices, some increase in metal removal can be achieved by the abrasive in the roll, although the abrasive is extremely fine and the abrasive is not added to the etchant. Also, the 1 inch of head contact speeds up the process. However even this abrasive can leave some slight scratching. Therefore, where a significant amount of material must be removed, multiple passes are performed or a machine with multiple heads is utilized, with all but the last pass or head preferably being a roll of the type described with respect to FIG. 9, whereas the final pass or last head is a roll of the type described in FIG. 10 to assure a final product in which the metal 104 is essentially flat, smooth and coplanar with the photo resist 102 as shown in FIG. 8.

Figure 11:
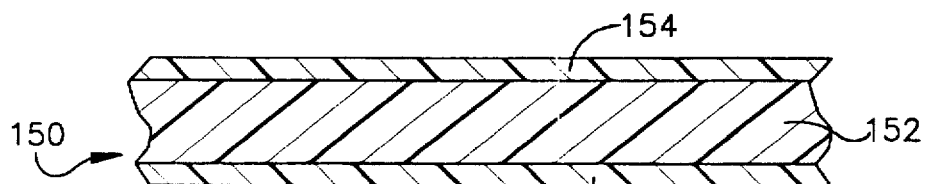
FIG. 11 is a sectional view, somewhat diagrammatic, of a portion of a circuit board core which is copper plated or laminated on both surfaces prior to drilling.
Figure 12:
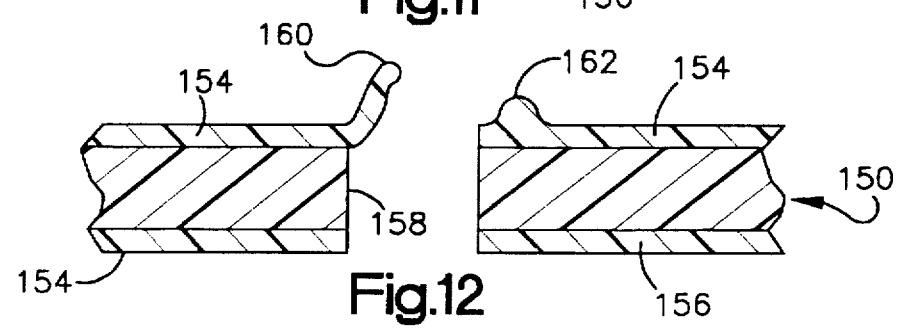
FIG. 12 is a view of the core of FIG. 11 showing a hole having been drilled therein.
Figure 13:
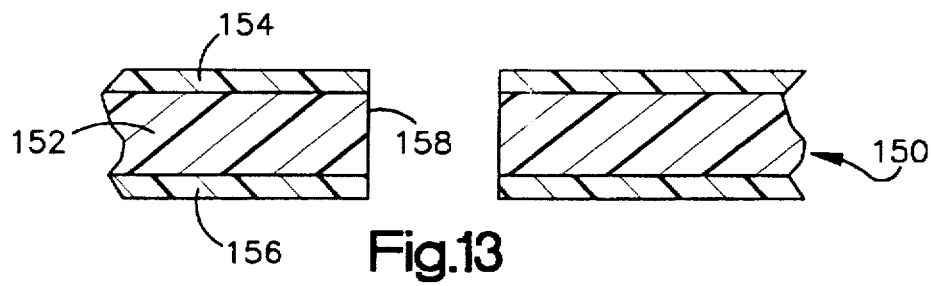
FIG. 13 is a view similar to FIG. 12 showing the core after processing to remove the burrs and pigtails.

Referring now to FIGS. 11 through 13, a circuit board core is shown which is processed according to this invention after initial lamination or plating and drilling of copper metal on dielectric substrates. FIG. 11 shows a portion of a core member 150 which includes a dielectric substrate 152, such as FR4 (which is a glass-filled epoxy), having a thin sheet of copper 154 laminated to one surface thereof and a thin sheet of copper 156 laminated to the opposite surface thereof. Typically, the substrate is about 7–10 mils thick and each of the copper sheets is about 0.3 to about 0.5 mils thick.

In certain types of core manufacture, it is necessary to form holes through the core 150. One typical or conventional way of forming such holes is by mechanical drilling, and a hole 158 is shown drilled through the core 150 as shown in FIG. 12. As can be seen in FIG. 12, the hole passes completely through the copper sheets 154 and 156, as well as the substrate 152. In this case, the hole will have been drilled starting at the foil 156 and then through the substrate 152 and finally through the foil 154. When the hole is drilled in this direction, very often the result is that pigtails 160 or burrs 162 are formed around the hole which has been drilled. It is often required that the burrs 162 and pigtails 160 be removed before the core member is further processed. This is accomplished using the device as shown in FIGS. 1 through 6.

The board in the condition shown in FIG. 12 is passed through the device with the head 118 rotating in contact with the surface of the copper 154 in a manner as previously described. For this type of burr removal, it is preferred to use a roll 118 of the type shown in FIG. 10 with the polyester film 120 having silicon grit of about 5 microns embedded therein as previously described. The etchant should be essentially free of abrasives. The preferred etchant for etching copper is cupric chloride and hydrochloric acid as described above. However, also as described above, if other metals such as aluminum are used to form the circuitry, etchants such as hydrochloric acid would be used.

The core in the condition shown in FIG. 12 is passed in a single pass past the planarizing head 18. Preferably, the core is moved at the speed of about 90 inches per minute, and the flow rate of the etchant is preferably from about 0.1 to about 0.15 gallons per minute. As a result of the single pass, the pigtails 160 and burrs 162 are removed to provide an essentially flat upper surface to the copper 154 as shown in FIG. 13. Since the drilling has all been done from one direction, it is normally necessary to only pass the side having the copper 154 past the planarizing head 18 and it is not necessary to similarly treat the copper 166 on the opposite side.

Figure 14:
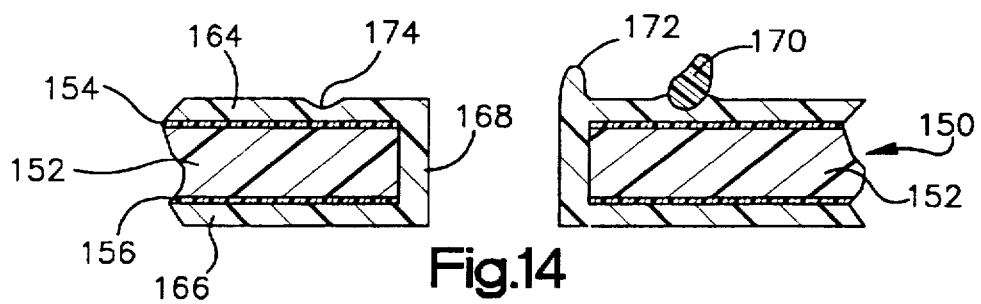
FIG. 14 is a view of a core member after it has been plated to form surface copper and a plated through hole.
Figure 15:
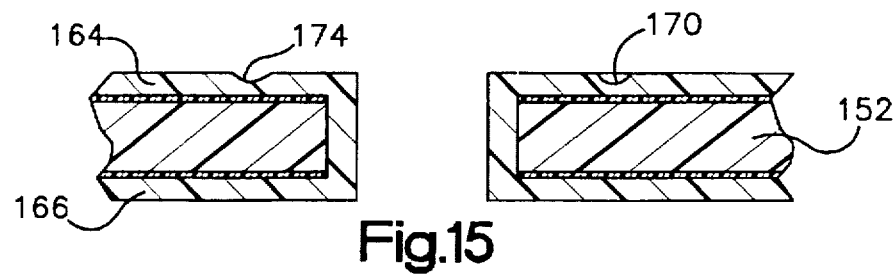
FIG. 15 is a view similar to FIG. 14 with a first step for removing surface imperfections having been performed.
Figure 16:
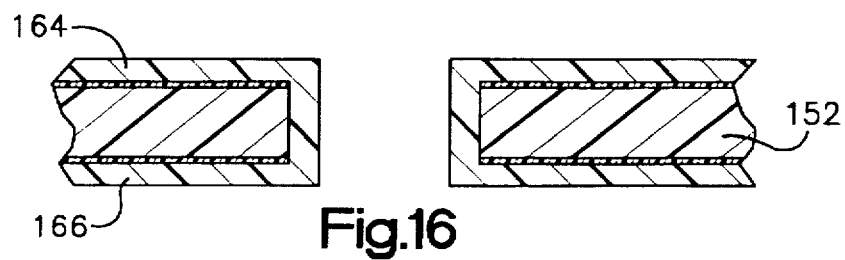
FIG. 16 is a view similar to FIG. 15 with the surface imperfections having been complete removed from the copper.

Referring now to FIGS. 14 through 16, a core member for a circuit board is shown being planarized at a different stage in the processing. Indeed, the board as shown in FIG. 13 can be the starting point for the processing shown in FIGS. 14–16. As shown in FIG. 14, the core at the stage of processing as shown in FIG. 13 is plated with copper 164 on top of the foil 154, copper 166 on top of the foil 156 and in the through hole 158 with copper 168.

Typically, the thickness of the copper layer on both sides are each about 1 mil thick. This copper is plated in a conventional manner to provide the basis for forming electrical circuitry by photolithographic processes using subtractive etching.

The plating process, can cause several kinds of defects. For example, nodules such as shown schematically at 170 can form in the copper, which nodules rise above the surface of the copper 164; bumps 172 can form at various places on the surface of the copper 164, and depressions 174 can be formed in the copper 164, all as a result of the plating process. (It should be noted that these defects can be on both sides of the core 150, i.e., they can be in the copper plate 168, as well as in the copper plate 164.)

To remove these imperfections and to form a smooth surface, the core 150 in the condition shown in FIG. 14 is passed through the planarizing device as described in FIGS. 1–6. Depending upon whether a very smooth surface is required, such as when the end product is to be used as a chip carrier or a lesser smoothness of the surface is required, such as when the core is going to be used either for further lamination or for circuit boards, the imperfections can be removed in either one or two passes. During the first pass, the board in the condition shown in FIG. 14 is passed through the machine using the roll 118 shown in FIG. 10 with the etchant being cupric chloride and hydrochloric acid essentially free of abrasive material. The head as shown in FIG. 10 has silicon carbide grit of about 15 microns in size embedded in the polyester film 120 for this pass. Preferably, the core travels at about 40 inches per minute, and the etchant is applied at a flow rate of about 0.1 to about 0.15 gallons per minute. During this pass, the nodule 170, the bump 172, and to some extent the depression 174 are smoothed to the condition as depicted in FIG. 15. In this case, the nodule 170 and bump 172 have been essentially removed, leaving a flat surface on the copper 164, although the remnants of the nodule 170 can be seen and will remain. The 15-micron grit head together with the etchant will smooth out somewhat the depression 174, although some depressions will remain depending on their depth, also as shown in FIG. 15.

For many applications, this single pass and polish etching to this condition will result in a satisfactory surface finish. However, if the core 150 is used as a chip carrier, it requires a very smooth surface essentially free of defects. A second pass can be made through the machine using a head 18 as shown in FIG. 10, but with a silicon carbide grit of about 5 microns in size embedded in the polyester film 120, again using the cupric chloride and hydrochloric acid as the etchant essentially free of abrasive material and the same speed and etchant flow rate as the first pass. This will result in a very smooth surface, as depicted in FIG. 16. If there are to be multiple passes, this can be done either by multiple passes through a single-head machine or by utilizing the machine with multiple heads using a single pass.

While the process depicted in FIGS. 11–13 have been related specification to a core having a dielectric thin copper foil on each size, it is equally applicable where drilling operations take place leaving burrs on the surface. Similarly, while the process shown in FIGS. 14–16 has been shown with the copper being plated over the core after reaching the stage shown in FIG. 13, it is equally applicable to other plating processes where nodules, bumps and depressions result from the plating.

It should be noted that the surfaces being treated as shown in FIGS. 11–13 and plated as shown in FIGS. 14–16 are essentially continuous and have localized surface defects distributed about the surface of the metal, while the planarizing described with respect to FIGS. 7 and 8 is done on a circuitized board having generally rough surfaces of the circuit features which must be planarized to the level of the photoresist.

Also, it is to be understood that the various processing parameters, such as line speed, etchant flow rates, chemistry of etchants, and thickness dimensions can be varied.

Accordingly, the preferred embodiments of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. In the manufacture of a printed circuit board or chip carrier, a method of removing localized surface defects from an essentially continuous layer of metal on a dielectric substrate wherein said surface defects are localized and distributed about said metal layer and extend upwardly from an exposed surface of said metal comprising the steps of;

providing a polishing head having a surface material thereon in which abrasive particles are embedded, continuously moving said polishing head with said polishing head in contact with the said defects, moving said substrate past said head, and continuously supplying a chemical etchant essentially free of abrasive material to the interface between the head and the defects to thereby reduce the height of said defects to the level of the exposed surface.

2. The method of claim 1 wherein said metal layer is copper.

3. The method of claim 2 wherein said etchant is cupric chloride and hydrochloric acid.

4. The method of claim 1 wherein the substrate is passed with the metal in contact with a head a plurality of times.

5. The method as defined in claim 1 wherein said defects are generated at least in part by mechanical drilling of holes through said substrate and said layer of metal.

6. The method of claim 1 wherein said abrasive particles are from about 5μ to about 15μ in size.

7. The method as defined in claim 6 wherein said abrasive is about 5μ in size.

8. The method as defined in claim 6 wherein said abrasive is about 15μ in size.

9. The method as defined in claim 2 wherein said defects are the result of plating of said copper metal.

10. The method as defined in claim 9 wherein said particles are about 15μ in size.

11. The method of claim 9 wherein said substrate is passed with the copper in contact with the head a plurality of times.

12. The method of claim 11 wherein said abrasive particles in said polishing head are about 15μ in size for the first time of contact of the metal with the head and about 5μ in size for the last time of contact of the metal with the head.

* * * * *